United States Patent [19]

Dershem et al.

[11] Patent Number: 5,045,127

[45] Date of Patent: Sep. 3, 1991

[54] NON-IONIC, WATER WASHABLE SOLDERING PASTE

[75] Inventors: Stephen M. Dershem, Santee; Richard R. Weaver, Poway, both of Calif.

[73] Assignee: Quantum Materials, Inc., San Diego, Calif.

[21] Appl. No.: 532,912

[22] Filed: Jun. 4, 1990

[51] Int. Cl.$^5$ ............................................. B23K 35/34
[52] U.S. Cl. ...................................... 148/23; 148/22; 148/24; 148/25
[58] Field of Search ..................................... 148/22-26

[56] References Cited

U.S. PATENT DOCUMENTS 2,664,371 12/1953 Snell ........................................ 148/23
3,330,028 7/1967 Elbreder ................................. 148/26

Primary Examiner—Peter D. Rosenberg
Attorney, Agent, or Firm—Baker, Maxham, Jester & Meador

[57] ABSTRACT

Improved soldering paste for the surface mounting of electronic components comprises a novel fluxing agent selected from quaternary ammonium hydroxides and mixtures thereof. Use of these agents as fluxes eliminates the problem of ionic residues on circuit boards and permits the boards to be washed with water to remove any non-ionic residues.

13 Claims, No Drawings

NON-IONIC, WATER WASHABLE SOLDERING PASTE

BACKGROUND OF THE INVENTION

The present invention relates to the art of assembling electronic devices, and more particularly, to an improved non-ionic, water washable soldering paste that eliminates ionic residues and optionally permits printed circuit boards to be washed with water.

Soldering pastes have been used for a number of years in the assembly of electronic components, such as integrated circuit packages which are mounted on a base member, (i.e. a dielectric substrate) and electrically connected to a conductive circuit formed on or otherwise attached to the base member. The soldering paste is applied to selected regions of the conductive circuit by a deposition process, such as stenciling or screening. Electronic components are then positioned on the base member and the entire assembly is fired in a heating chamber to bond the components to the conductive circuit.

Soldering pastes contain a flux that functions to eliminate oxide contamination and/or prevent further oxidation of the solder upon reflow. Reflow is defined herein as the fusion of solder particles into a homogeneous bead of molten solder. Reflow takes place when solder is heated to a temperature equal to or greater than its melting point. Organic components in soldering pastes and fluxes are desirably vaporized during the soldering process, however some components leave residues that must be removed by organic solvents, specifically chlorofluorocarbons. The use of chlorofluorocarbons is extremely worrisome since these materials are reportedly the agents responsible for destroying the ozone layer. Depletion of the ozone layer contributes to increased UV exposure which is the primary cause of skin cancer.

Attempts have been made in the past to develop soldering pastes and fluxes that leave no residue or leave a residue that can be removed with water. These attempts, however, have not been totally successful for various reasons. For example, although commercially available water washable soldering pastes provide a distinct advantage over pastes that leave residues requiring removal by chlorofluorocarbons, the former may leave ionic residues which cannot be totally removed with water. When such residues remain on a circuit board, they create an ionic environment which causes the board to short out.

U.S. Pat. No. 3,223,561, granted Dec. 14, 1965 to Durham et.al., discloses the use of an amine salt in a soldering flux. Although use of an amine salt eliminates the damage that occurs with strong fluxing agents, the amine salt leaves ionic residues which are unacceptable.

In view of the foregoing, it is obvious that a non-ionic, water washable soldering paste would be very desirable.

SUMMARY OF THE INVENTION

The present invention relates to an improved soldering paste, and more particularly to a non-ionic, water washable soldering paste for surface mounting of electronic devices on circuit boards. The soldering paste of the present invention comprises solder powder, a fluxing agent selected from quaternary ammonium hydroxides and mixtures thereof and organic solvent.

The soldering paste of the invention may also comprise an auxiliary fluxing agent selected from compounds having the formula $XC(R_1)(R_2)CO_2H$ where X is $NO_2$, $CN$, $CO_2H$, $RC(O)$ or some other strongly electron withdrawing group other than halogen, and wherein R is lower alkyl and $R_1$ and $R_2$ are independently hydrogen and lower alkyl, and mixtures of such compounds.

The present invention also relates to a method for removing metal oxides from an oxidized surface by contacting the surface with a soldering flux consisting essentially of a quaternary ammonium hydroxide fluxing agent and organic solvent. The present invention still further relates to a method for removing metal oxides from an oxidized surface by contacting the surface with a soldering flux consisting essentially of a quaternary ammonium hydroxide fluxing agent, an auxiliary fluxing agent, as previously defined, and organic solvent.

DETAILED DESCRIPTION

The function of a soldering flux is to eliminate oxide contamination and/or prevent further oxidation of the solder upon reflow. However, if a flux is not completely removed from the surface subjected to soldering, the surface can be rendered ionic. If the surface is a circuit board, the board may short out. The present invention avoids the problem posed by ionic residues by employing a fluxing agent that does not generate such residues. The primary fluxing agents employed herein are quaternary ammonium hydroxides. These substances appear to be ideal fluxing agents in that they leave negligible ionic residues following reflow. Any non-ionic residues which do form can be removed with water.

When heated, a quaternary ammonium hydroxide such as tetramethylammonium hydroxide decomposes to methanol and trimethylamine. With higher alkylammonium hydroxides, thermal decomposition leads to the formation of an alkene and the corresponding tertiary amine. In both cases, the products of decomposition are highly volatile thereby eliminating the problem of ionic residues.

Quaternary ammonium hydroxides that are suitable for use in the present invention include substances wherein the groups covalently bonded to the nitrogen are independently selected from lower alkyl and hydroxysubstituted lower alkyl. The term "lower alkyl" as used herein refers to $C_1$–$C_4$ straight and branched chain aliphatic hydrocarbon groups such as methyl, ethyl, propyl, isopropyl, and the like. Specific examples of quaternary ammonium hydroxides that may be used in the present invention include, for example, tetramethylammonium hydroxide, tetraethylammonium hydroxide, tetrabutylammonium hydroxide, tetrapropylammonium hydroxide, methyltriethylammonium hydroxide, methyltributylammonium hydroxide, methyltripropylammonium hydroxide, ($\beta$-hydroxyethyl) trimethylammonium hydroxide (also known as choline hydroxide) and mixtures of such substances.

Preferred quaternary ammonium hydroxide fluxing agents are trimethylammonium hydroxide and choline hydroxide. Tetramethylammonium hydroxide has the highest thermal stability and accordingly is the preferred fluxing agent when a high temperature alloy is employed in a soldering paste of the invention.

The quaternary ammonium hydroxides used herein can be obtained commercially or alternatively synthesized using well-known techniques. For example, when a suitable quaternary ammonium halide is treated with moist silver (I) oxide, a silver halide precipitates. Filtration of the mixture and subsequent evaporation of the filtrate produces the desired quaternary ammonium hydroxide.

The soldering pastes of the present invention may also contain an auxiliary fluxing agent. Such an agent is selected from compounds of the formula $XC(R_1)(R_2)CO_2H$ where X is $NO_2$, CN, $CO_2H$, RC(O) or some other strongly electron withdrawing group other than halogen and wherein R is lower alkyl and $R_1$ and $R_2$ are independently hydrogen and lower alkyl, and mixtures of such compounds. The term lower alkyl is as defined above. Examples of such compounds include, for example, cyanoacetic acid, malonic acid, dimethyl malonic acid, diethylmalonic acid, nitroacetic, ketoglutaric acid, and the like. Substances which are utilized as auxiliary fluxing agents in the present invention must volatilize completely during reflow.

Solder alloys that may be used in the soldering pastes of present invention include powder alloys that preferably melt at or below 310° C. Examples of suitable solders include 60/40 Sn/Pb and 63/37 Sn/Pb. Additional solders that can be utilized in the present invention include those containing tin, lead and silver (Ag) such as, for example, 62/36/2 Sn/Pb/Ag, 10/88/2 Sn/Pb/Ag and 62/36/2 Sn/Pb/Ag.

Suitable organic solvents which may be utilized in the soldering pastes of the present invention include, for example, 1,4-Cyclohexanedimethanol, α-terpineol, neopentyl glycol, 2,2,4-trimethyl-1,3,-pentanediol monoisobutyrate and the like, as well as mixtures thereof The term "organic solvent" as used herein can refer to a single solvent or a mixture of solvents. The preferred organic solvent utilized in the soldering pastes of the invention comprises a mixture of solvents having a range of boiling points thereby enabling sequential evaporation to occur as the solder paste is heated to the reflow temperature. Use of such a solvent mixture also prevents the evaporation of all solvent prior to reflow and thus helps prevent oxidation that can occur when no residual solvent remains to act as a blanket to avert further oxidation.

Although high boiling solvents can be utilized in the present invention to minimize potential oxidation of the solder before reflow, the most preferred soldering pastes of the invention also include a water soluble, non-ionic chelating agent such as mannitol. Mannitol decomposes above the reflow temperature of most commercial solders and appears to assist in solubilizing metal oxides.

The improved non-ionic soldering pastes of the invention comprise from about 80 to about 95 weight percent solder; from about 0.2 to about 9 weight percent fluxing agent; and from about 5 to about 20 weight percent solvent. When the pastes of the invention comprise both a quaternary ammonium hydroxide fluxing agent and an auxiliary fluxing agent, the former is present in an amount ranging from about 2 to about 45 weight percent total fluxing agent, preferably about 5 to 15 weight percent, and the latter is present in an amount ranging from about 55 to about 98 weight percent total fluxing agent, preferably about 85 to 95 percent. Although auxiliary fluxing agent alone provides adequate reflow, it also produces an intractable, non-water washable residue. However, when the auxiliary fluxing agent is used in combination with a quaternary ammonium hydroxide fluxing agent, the residue problem is eliminated. Surprisingly, the ratio of quaternary ammonium hydroxide fluxing agent to auxiliary fluxing agent can be as low as 1:49 and still avoid the residue problem.

Mannitol, when employed in the soldering pastes of the invention, is present in an amount ranging from about 0.1 to about 12 weight percent of the total paste composition.

The soldering pastes of the invention are prepared by first combining organic solvent, fluxing agent(s) and any other desired components such as mannitol, and subjecting the mixture to blending or mixing until a homogeneous mixture is achieved. The resulting mixture is then added to a suitable solder powder in a Hobart mixer and mixing is carried out for approximately thirty minutes to obtain the improved, non-ionic water washable solder pastes of the invention.

The method of the present invention for removing metal oxides from an oxidized surface comprises simply contacting the surface with a soldering flux consisting essentially of the desired quaternary ammonium hydroxide(s) fluxing agent, and optionally, the desired auxiliary fluxing agent(s), and organic solvent. Solvents utilized for this purpose are hydrophilic solvents such as, for example, propylene glycol, methanol, 2-methyl-2,4-pentanediol, and the like, as well as mixtures of such solvents. The soldering fluxes of the invention comprise from about 1 to about 45 weight percent total fluxing agent.

Because the soldering pastes of the invention are water washable, ordinary water can be used to remove flux residues. Many soldering pastes currently in use require the use of either chlorofluorocarbon solvents or concentrated caustic saponifiers to effect the removal of flux residues. As mentioned previously, the continued use of chlorofluorocarbons is extremely worrisome since these materials are reportedly the agents responsible for destroying the ozone layer.

The invention will now be described in greater detail with reference to the following non-limiting examples.

EXAMPLE I

A commercially available 15 weight percent solution of tetramethylammonium hydroxide in propylene gycol is the source of quaternary ammonium hydroxide in this Example. A quantity of this solution is combined with the below listed substances in the indicated weight percentages:

| Ingredient | Percentage |
| --- | --- |
| 1,4 Cyclohexanedimethanol | 30.0 |
| Terpineol | 18.0 |
| Neopentyl glycol | 16.5 |
| d-mannitol | 28.0 |
| Diethylmalonic acid | 5.0 |
| Tetramethylammonium hydroxide solution | 2.5 |

A non-ionic, water washable soldering paste is formulated by mixing 5 Kg of the above obtained homogeneous mixture with 45 Kg of solder having a Sn:Pb ratio of 63/37. The mixing is carried out in a Hobart mixer for approximately 30 minutes. After mixing is complete, the viscosity may be adjusted by the addition of additional mixture or solvent.

EXAMPLE II

A commercially available 15 weight solution of tetramethylammonium hydroxide in propylene gycol is the source of quaternary ammonium hydroxide in this Example. A quantity of this solution is combined with the below listed substances in the indicated weight percentages:

| Ingredient | Percentage |
| --- | --- |
| 1.4 Cyclohexanedimethanol | 31.5 |
| Neopentyl glycol | 31.5 |
| d-mannitol | 27.0 |
| Tetramethylammonium hydroxide solution | 10.0 |

A non-ionic, water washable soldering paste is formulated by mixing 5 Kg of the above obtained homogeneous mixture with 45 Kg of solder having a Sn:Pb:Ag ratio of 62/36/2. The mixing is carried out in a Hobart mixer for approximately 30 minutes. After mixing is complete, the viscosity may be adjusted by the addition of additional mixture or solvent.

EXAMPLE III

A commercially available 45 weight percent solution of choline hydroxide in methanol is the source of quaternary ammonium hydroxide in this Example. A quantity of this solution is combined with the below listed substances in the indicated percentages:

| Ingredient | Percentage |
| --- | --- |
| 1,4 Cyclohexanedimethanol | 31.5 |
| Neopentyl glycol | 31.5 |
| d-mannitol | 27.0 |
| Tetramethylammonium hydroxide solution | 10.0 |

A non-ionic, water washable soldering paste is formulated by mixing 5 Kg of the above obtained homogeneous mixture with 45 Kg of solder having a Sn:Pb ratio of 60/40. The mixing is carried out in a Hobart mixer for approximately 30 minutes. After mixing is complete, the viscosity may be adjusted by the addition of additional mixture or solvent.

While the invention has been described in detail with reference to certain preferred embodiments thereof, it will be understood that modifications and variations are within the spirit and scope of that which is described and claimed. Particular features of the invention are emphasized in the claims which follow.

What is claimed is:

1. A non-ionic, water washable soldering paste composition comprising:
   solder powder;
   a thermally decomposable fluxing agent selected from quaternary ammonium hydroxides and mixtures thereof, said agent decomposing into volatile products; and
   organic solvent.

2. A soldering paste composition according to claim 1 wherein said quaternary ammonium hydroxides comprise substances wherein groups covalently bonded to the nitrogen are independently selected from lower alkyl and hydroxysubstituted lower alkyl.

3. A soldering paste composition according to claim 2 wherein said quaternary ammonium hydroxide fluxing agent comprises from about 0.1 to about 9 weight percent of the total paste composition.

4. A soldering paste composition according to claim 2 wherein said quaternary ammonium hydroxide fluxing agent is tetramethylammonium hydroxide.

5. A soldering paste composition according to claim 2 wherein said quaternary ammonium hydroxide fluxing agent is ($\beta$-hydroxyethyl)trimethylammonium hydroxide.

6. A non-ionic, water washable soldering paste composition comprising:
   solder powder;
   a thermally decomposable primary fluxing agent selected from quaternary ammonium hydroxides and mixtures thereof;
   an auxiliary fluxing agent selected from compounds of the formula:

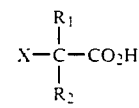

where X is $NO_2$, CN, $CO_2H$, RC(O) or some other electron withdrawing group other than halogen, R is lower alkyl and $R_1$ and $R_2$ are independently hydrogen and lower alkyl, and mixtures of such compounds; and
   organic solvent.

7. A soldering paste composition according to claim 6 wherein total fluxing agent comprises from about 0.2 to about 9 weight percent of the total paste composition.

8. A soldering paste composition according to claim 7 wherein said fluxing agent comprises from about 2 to about 45 weight percent quaternary ammonium hydroxide fluxing agent and from about 55 to about 98 weight percent auxiliary fluxing agent.

9. A soldering paste composition according to claim 6 wherein said quaternary ammonium hydroxides comprise substances wherein groups covalently bonded to the nitrogen are independently selected from lower alkyl and hydroxysubstituted lower alkyl.

10. A soldering paste composition according to claim 9 further comprising mannitol.

11. A soldering paste composition according to claim 10 wherein said quaternary ammonium hydroxide fluxing agent is tetramethylammonium hydroxide and said auxiliary fluxing agent is diethylmalonic acid.

12. A method for removing metal oxides from an oxidized surface, said method comprising contacting said surface with a soldering flux consisting essentially of a thermally decomposable fluxing agent selected from quaternary ammonium hydroxides and mixtures thereof; and organic solvent.

13. A method according to claim 12 wherein said soldering flux further comprises an auxiliary fluxing agent selected from compounds of the formula:

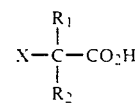

where X is $NO_2$, CN, $CO_2H$, RC(O) or some other electron withdrawing group other than halogen and wherein R is lower alkyl and $R_1$ and $R_2$ are independently hydrogen and lower alkyl, and mixtures of such compounds.

* * * * *